United States Patent
Chen et al.

(10) Patent No.: US 7,091,592 B2
(45) Date of Patent: Aug. 15, 2006

(54) STACKED PACKAGE FOR ELECTRONIC ELEMENTS AND PACKAGING METHOD THEREOF

(75) Inventors: Shou-Lung Chen, Hsinchu (TW);
Fang-Jun Leu, Hsinchu (TW);
I-Hsuan Peng, Hsinchu (TW);
Shan-Pu Yu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 2 days.

(21) Appl. No.: 10/780,875

(22) Filed: Feb. 19, 2004

(65) Prior Publication Data

US 2004/0238933 A1    Dec. 2, 2004

(30) Foreign Application Priority Data

May 27, 2003    (TW)    ................. 92114246 A

(51) Int. Cl.
*H01L 23/02*    (2006.01)
*H01L 23/04*    (2006.01)
*H01L 23/48*    (2006.01)

(52) U.S. Cl. .............. 257/686; 257/698; 257/733; 257/735; 257/737; 257/773

(58) Field of Classification Search ............... 257/685, 257/686, 698, 699, 723, 733, 735, 737, 773, 257/777
See application file for complete search history.

(56) References Cited

U.S. PATENT DOCUMENTS

| 6,297,548 B1 * | 10/2001 | Moden et al. | 257/686 |
| 6,577,013 B1 * | 6/2003 | Glenn et al. | 257/777 |
| 2002/0036338 A1 * | 3/2002 | Matsuo et al. | 257/686 |

* cited by examiner

*Primary Examiner*—Hung Vu
(74) *Attorney, Agent, or Firm*—Birch, Stewart, Kolasch & Birch, LLP

(57) ABSTRACT

A stacked package for electronic elements is provided, a plurality of stud bumps are formed on a substrate by means of a stud bump process to align with a plurality of vias of one provided electronic element. The stud bumps respectively pass through the vias and electrically connect the electronic element. Furthermore, additional electronic elements are stacked on the carrier according to a similar way to form a stacked electronic package.

18 Claims, 4 Drawing Sheets

STACKED PACKAGE FOR ELECTRONIC ELEMENTS AND PACKAGING METHOD THEREOF

This Nonprovisional application claims priority under 35 U.S.C. § 119(a) on patent application No. 092114246 filed in TAIWAN on May 27, 2003, the entire contents of which are hereby incorporated by reference.

BACKGROUND OF THE INVENTION

1. Field of Invention

The present invention relates to a package for electronic elements and packaging method more particularly to a stacked package for electronic elements and packaging method thereof.

2. Related Art

A process of packaging electronic elements, also called electronic packaging, provides protection for the electronic element and further electrical connection between the electronic element and other external elements. The packaging process generally is a backend process in the semiconductor manufacturing, and therefore is not considered as important as the front-end process. However, the packaging process determines the size and the cost of the final product, which may also be of importance in the commercial success of the final product.

Conventionally, electronic packages are classified as a single chip package (SCP) type or a multi chip package (MCP) type, according to the amount of integrated chips (IC) mounted in the electronic package. The multi chip package further includes a multi chip module (MCM). MCP type package has become the main stream in the current field of electronic packaging because of several advantages such as a small size, low production costs, a high-density wiring and high performance. Further reducing the manufacturing cost and the size of the package has always been the goal of the research and development made by current package manufacturers.

Usually, Flip-Chip (According to your following description, I think use flip-chip is better than bga) is used as external connection to achieve the electrical connection between the chips in the multi chip package. Such a type of electronic package needs a lot of processing steps such as mask forming, a photolithography process, sputtering, plating, and solder ball forming, which renders the whole process complex and increases the possibility of destabilizing it. The packaging costs are thereby increased. Furthermore, the vias of the chip serve as vertical conductive paths of the chip. A conductive material has to be filled respectively in the vias. The alignment of the conductive material and filling of the conductive material in the vias constitute a difficult operation, which possibly destabilizes the yield and not is workable in mass production.

SUMMARY OF THE INVENTION

It is therefore an object of the invention to provide a stacked package of electronic element and a manufacturing method thereof that are simple to implement with reduced production costs.

In order to achieve the above and other objectives, the stacked electronic package and packaging process of the invention electrically connects adjacent electronic elements by means of forming stud bumps and vias. Thereby, the number of mask forming steps, photolithography steps, sputtering or plating steps, which are conventionally necessary to form the solder balls and bumps, is greatly reduced.

In the packaging process of the invention, a plurality of stud bumps is formed on a supporting surface of a substrate. At least one electronic element with a plurality of vias corresponding to the stud bumps is provided. The electronic element is mounted on the substrate such, that he stud bumps penetrate through the corresponding vias. Thereby, one electronic packaging unit is accomplished. A plurality of additional elements can be stacked in sequence on the electronic package similarly to the way described above. The locations of the stud bumps on each layer of electronic element can be changed according to the circuit design. For example, the stud bumps on the different electronic element may be or may not be aligned with one another. Thereby, a multi chip package (MCP) or multi chip module (MCM) package is accomplished. In the invention, a solder paste is further applied over an exposed surface of the stud bumps on the topmost electronic element, and then is re flowed to flow down through the vias along the stud bumps to securely connect the electronic elements. Alternatively, the solder paste is replaced with liquid conductive glue. In this case, a curing process is performed instead of the reflow process.

An electronic package of the invention includes a substrate having a supporting surface on which a plurality of stud bumps is formed; and at least one element having a plurality of vias corresponding to the stud bumps. The vias are respectively aligned with the stud bumps that pass through the vias so that the electronic element is securely mounted on the substrate. Furthermore, the invention includes a solder paste flowing through the vias along the stud bumps.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent from this detailed description to those skilled in the art.

BRIEF DESCRIPTION OF THE DRAWINGS

The present invention will become more fully understood from the detailed description given herein below illustration only, and is thus not limitative of the present invention.

DETAILED DESCRIPTION OF THE INVENTION

Figure 1A:
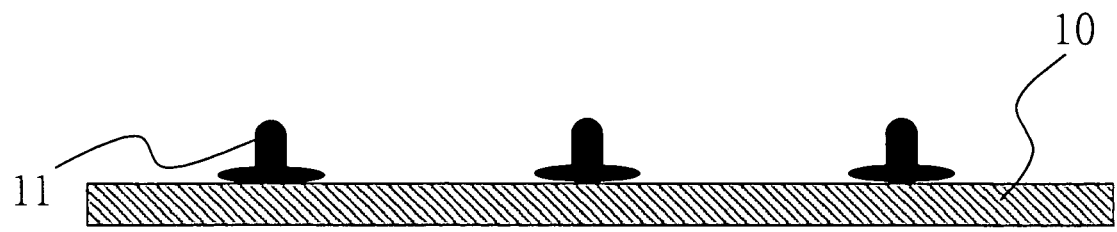
FIG. 1A to FIG. 1E are schematic views illustrating a process of packaging an electronic element according to a first embodiment of the invention.
Figure 1B:
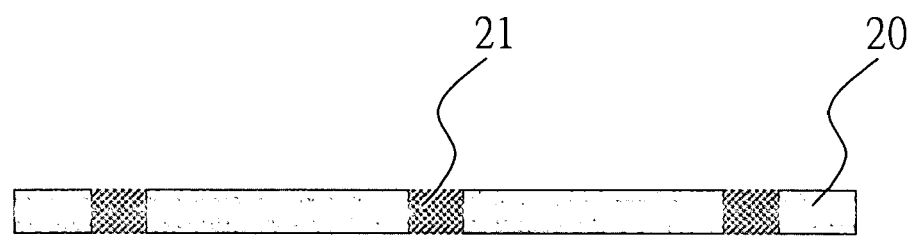
Figure 1C:
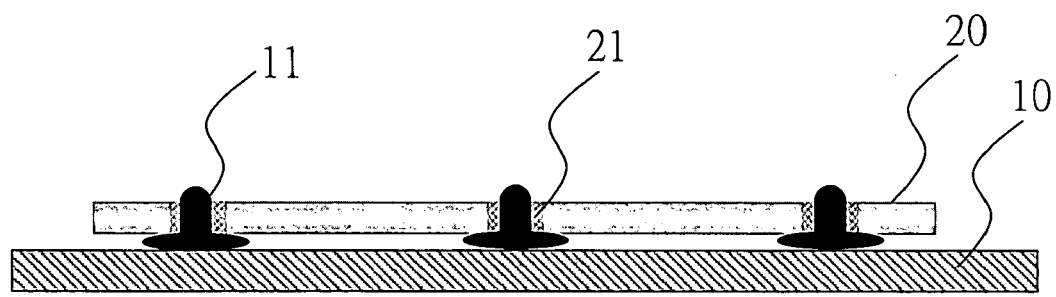

FIG. 1A to FIG. 1E show a process of forming a stacked electronic package according to one embodiment of the invention. Referring to FIG. 1A, a plurality of stud bumps 11 is formed on a supporting surface of a substrate 10 by using a stud bump forming process well known in the art. Referring to FIG. 1B, a first chip 20 with a plurality of vias 21 corresponding to the stud bumps 11 is provided. Referring to FIG. 1C, the first chip 20 is mounted on the substrate in such that the stud bumps penetrate through the corresponding vias 21. The stud bumps 11 exceed the height of the vias 21.

Figure 1D:
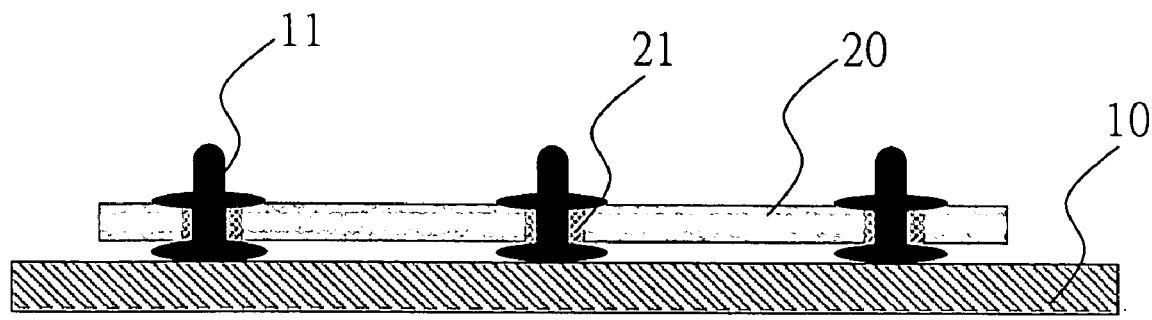
Figure 1E:
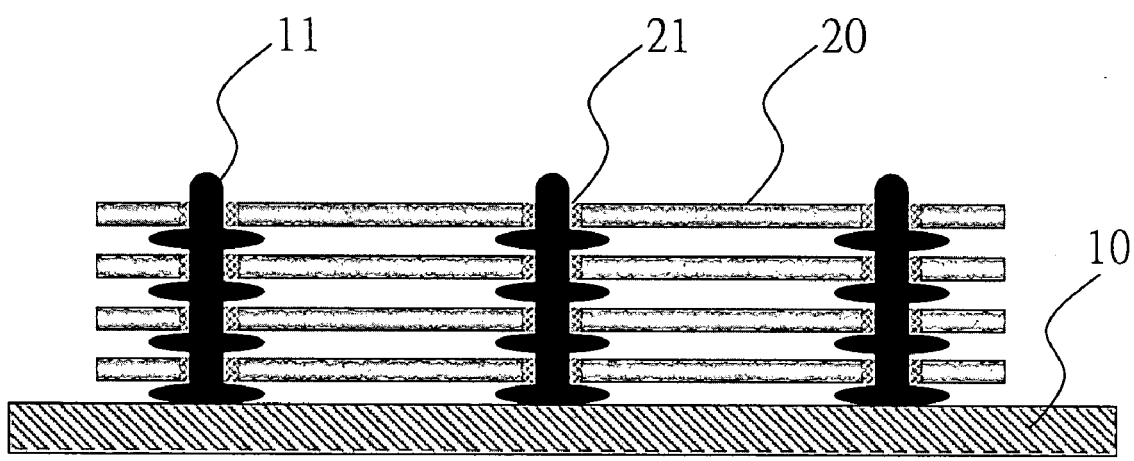

Thereby, the first chip 20 and the substrate 10 form a first electronic packaging unit. Referring to FIG. 1D, the first electronic packaging unit is used as a carrier for carrying another chip. A plurality of stud bumps 11 is formed on the first chip 20 of the first electronic packaging unit. A second chip 20 is placed on the first chip 20 of the first packaging unit. A third chip, fourth chip and so on are sequentially stacked on one another, as shown in FIG. 1E. In this embodiment of the invention, the stud bumps 11 of different elements are aligned with one another. In other embodiments of the invention, the locations of the stud bumps may be changed according to the circuit design. For example, the locations of the stud bumps of the additional chips may be not aligned with those of the first chip.

Figure 2A:
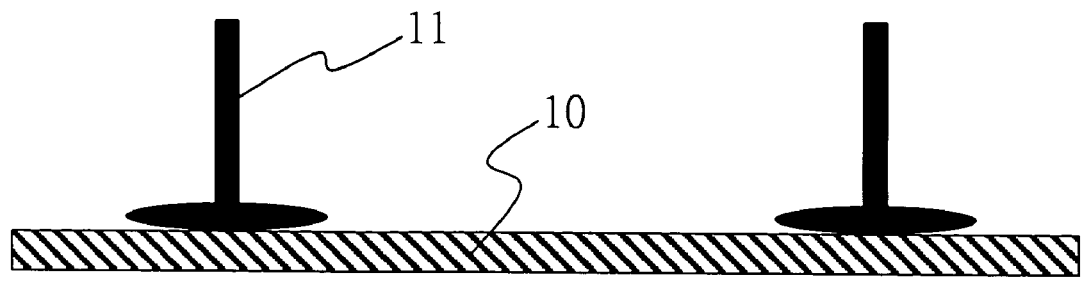
FIG. 2A to FIG. 2D are schematic views illustrating a process of packaging an electronic element according to a second embodiment of the invention.
Figure 2B:
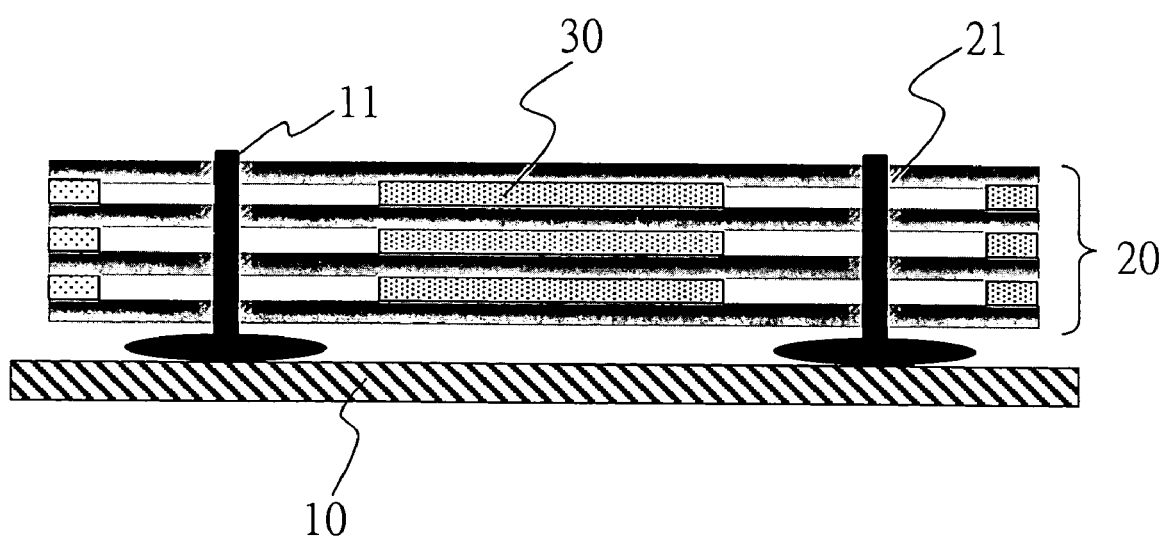
Figure 2C:
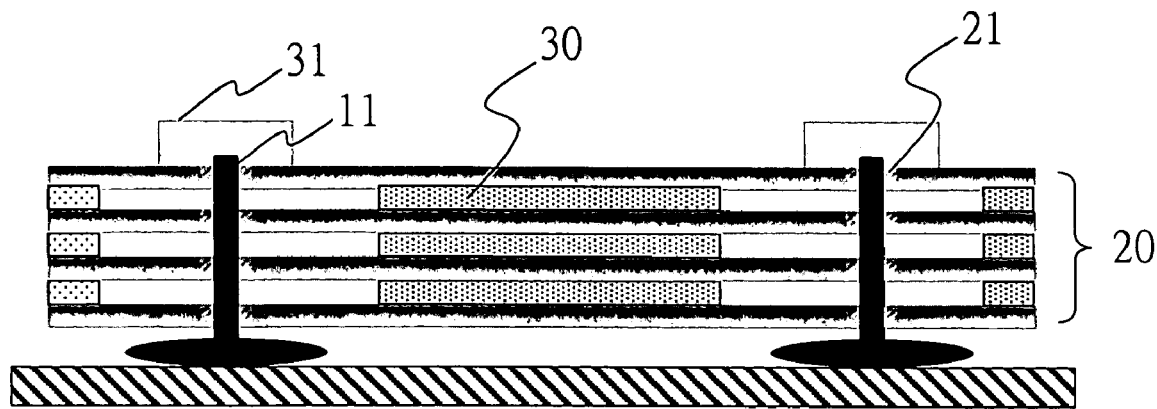
Figure 2D:
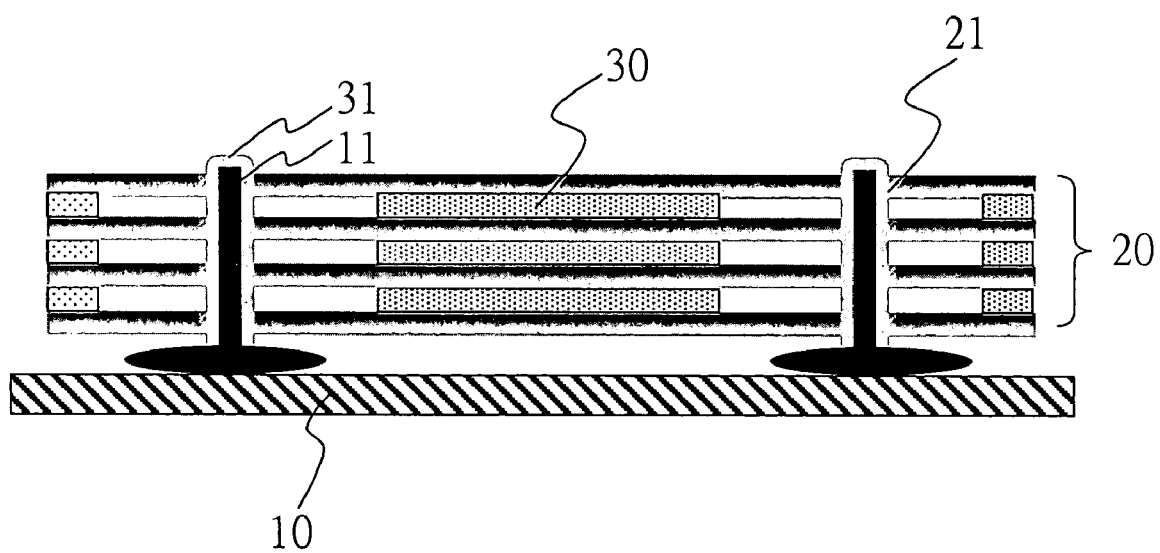

Alternatively, a plurality of high stud bumps is formed on the supporting surface of the substrate. A plurality of chips is connected through single stud bumps. FIG. 2A to FIG. 2D illustrate a process of packaging a stacked electronic package. Referring to FIG. 2A, a plurality of stud bumps 11, each having a height of about 300 micrometers, are formed on a supporting surface of a substrate 10. Referring to FIG. 2B, four first chips 20 with a plurality of vias 21 corresponding to the stud bumps 11 are provided. Each stud bump 11 aligns with its corresponding vias 21 of each chip 20. The chips 20 are placed on the substrate 10 in sequence, with a spacer 30 there between. Referring to FIG. 2C, a solder paste 31 is applied over the stud bumps on the exposed surface of the topmost chip 20. Referring to FIG. 2D, a reflow process then is performed to allow the solder paste 31 to flow down through the vias 21 of the chips 20 along the stud bumps 11. The chips 20 are fastened in series after the solder paste 31 is cured.

Alternatively, the solder paste can be replaced with conductive glue. Liquid conductive glue is applied over the stud bumps on the exposed surface of the topmost chip. The liquid conductive glue flows down through the vias of the chip along the stud bumps.

In the invention, the stud bumps are made of a highly electrical conductive material such as metallic material, for example gold, copper or aluminum . . . The chip can be a semiconductor chip made of Si, GeAs, InP or formed by an epitaxy process. The substrate is, for example, an organic substrate, a ceramic substrate, a glass substrate, a silicon substrate, or a GaAs substrate. Furthermore, the substrate of the stacked electronic package is electrically connected to an external carrier by means of a pin grid array package (PGA) process, a solder ball array process, a wire bonding, a flip chip bonding process, a tape automated bonding (TAB) process or through a lead frame.

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stacked package for electronic elements, comprising:
   a substrate, having a supporting surface, wherein a plurality of stud bumps are formed on the supporting surface by a stud bump process and contact the supporting surface; and
   a plurality of electronic elements, each having a plurality of vias corresponding to the stud bumps, wherein the vias of each electronic element are respectively aligned with the stud bumps, each of the stud bumps being allowed to pass through the corresponding vias of the plurality of electronic elements so as to securely mount and stack the electronic elements on the substrate; and
   a solder paste that is applied over exposed surfaces of the stud bumps on the topmost electronic element, the solder paste being reflowed to flow down through the vias along the stud bumps so as to securely connect the electronic elements.

2. The stacked package for electronic elements of claim 1, further comprising a spacer between adjacent electronic elements.

3. The stacked package for electronic elements of claim 1, wherein the material of the stud bumps is a conductive metal.

4. The stacked package for electronic elements of claim 1, wherein the material of the stud bumps is gold, copper or aluminum.

5. The stacked package for electronic elements of claim 1, wherein the element is a silicon chip, a GaAs chip, an InP chip or a epitaxily-grown chip.

6. The stacked package for electronic elements of claim 1, wherein the substrate is an organic substrate, a ceramic substrate, a glass substrate, a silicon substrate or a GaAs substrate.

7. The stacked package for electronic elements of claim 1, wherein each of the stud bumps has a bottom wider than a width of the corresponding vias of the plurality of electronic elements.

8. The stacked package for electronic elements of claim 1, wherein the plurality of electronic elements are stacked from bottom to top as a stacked structure, and each of the stud bumps has a height larger than a height of the stacked structure.

9. The stacked package for electronic elements of claim 1, wherein the plurality of electronic elements are stacked from bottom to top as a stacked structure, and each of the stud bumps protrudes from a top surface of the topmost electronic element of the stacked structure.

10. A stacked package for electronic elements, comprising:
    a substrate, having a supporting surface, wherein a plurality of stud bumps are formed on the supporting surface by a stud bump process;
    a plurality of electronic elements, each having a plurality of vias corresponding to the stud bumps, wherein the vias of each electronic element are respectively aligned with the stud bumps, the stud bumps being allowed to pass through the vias so as to securely mount and stack the electronic elements on the substrate; and
    a conductive glue that is applied over the stud bumps on an exposed surface of the topmost electronic element, and flows through the vias along the stud bumps so as to securely connect the electronic elements.

11. The stacked package for electronic elements of claim 10, further comprising a spacer between adjacent electronic elements.

12. The stacked package for electronic elements of claim 10, wherein the material of the stud bumps is a conductive metal.

13. The stacked package for electronic elements of claim 10, wherein the material of the stud bumps is gold, copper or aluminum.

14. The stacked package for electronic elements of claim 10, wherein the element is a silicon chip, a GaAs chip, an InP chip or a epitaxily-grown chip.

15. The stacked package for electronic elements of claim 10, wherein the substrate is an organic substrate, a ceramic substrate, a glass substrate, a silicon substrate or a GaAs substrate.

16. The stacked package for electronic elements of claim 10, wherein each of the stud bumps has a bottom wider than a width of the corresponding vias of the plurality of electronic elements.

17. The stacked package for electronic elements of claim 10, wherein the plurality of electronic elements are stacked from bottom to top as a stacked structure, and each of the stud bumps has a height larger than a height of the stacked structure.

18. The stacked package for electronic elements of claim 10, wherein the plurality of electronic elements are stacked from bottom to top as a stacked structure, and each of the stud bumps protrudes from a top surface of the topmost electronic element of the stacked structure.

\* \* \* \* \*